(12) United States Patent
Li et al.

(10) Patent No.: US 6,194,230 B1
(45) Date of Patent: *Feb. 27, 2001

(54) ENDPOINT DETECTION BY CHEMICAL REACTION AND LIGHT SCATTERING

(75) Inventors: Leping Li, Poughkeepsie, NY (US); James Albert Gilhooly, Saint Albans; Clifford Owen Morgan, III, Burlington, both of VT (US); Cong Wei, Poughkeepsie, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,601

(22) Filed: May 6, 1998

(51) Int. Cl.$^7$ .......................... H01L 21/00; H01L 21/66; G01R 31/26
(52) U.S. Cl. .................................. 438/5; 438/14
(58) Field of Search .................. 438/5, 14; 216/58, 216/60; 156/345

(56) References Cited

U.S. PATENT DOCUMENTS

| | | | |
|---|---|---|---|
| 3,503,711 | * 3/1970 | Skala | 436/113 |
| 3,904,371 | 9/1975 | Neti et al. | 23/232 |
| 4,018,565 | * 4/1977 | Fletcher, III et al. | 205/788.5 |
| 4,268,279 | 5/1981 | Shindo et al. | |
| 4,493,745 | 1/1985 | Chen et al. | 156/626 |
| 4,512,964 | 4/1985 | Vayenas | 423/403 |
| 4,703,273 | * 10/1987 | Kolbe et al. | 324/314 |
| 4,812,416 | 3/1989 | Hewig et al. | 437/5 |
| 4,961,834 | 10/1990 | Kuhn et al. | 204/412 |
| 4,975,141 | * 12/1990 | Greco et al. | 216/60 |
| 5,234,567 | 8/1993 | Hobbs et al. | 204/415 |
| 5,242,532 | * 9/1993 | Cain et al. | 216/60 |
| 5,242,882 | 9/1993 | Campbell | 502/325 |
| 5,256,387 | 10/1993 | Campbell | 423/392 |
| 5,395,589 | 3/1995 | Nacson | 422/88 |
| 5,399,234 | 3/1995 | Yu et al. | 156/636 |
| 5,405,488 | 4/1995 | Dimitrelis et al. | 156/627 |
| 5,439,551 | 8/1995 | Meikle et al. | 156/626 |
| 5,559,428 | 9/1996 | Li et al. | 324/71.5 |
| 5,931,722 | * 8/1999 | Ohmi et al. | 451/271 |

FOREIGN PATENT DOCUMENTS 3-277947   12/1991   (JP) .............................. G01N/21/77

OTHER PUBLICATIONS

Carr et al., "End–point detection of CMP of Circuitized Multilayer Substrates", Sep. 1991, IBM Tech. Disc. Bull. vol. 34, No. 4B, pp. 406, 407.*

(List continued on next page.)

Primary Examiner—John F. Niebling
Assistant Examiner—Walter L. Lindsay, Jr.
(74) Attorney, Agent, or Firm—Alison D. Mortinger; Jay H. Anderson

(57) ABSTRACT

Detection of the endpoint for removal of a target film overlying a stopping film by removing the target film with a process that selectively produces a gaseous chemical reaction product (for example ammonia when polishing a wafer with a nitride film in a slurry containing KOH) with one of the stopping film and the target film, mixing the gaseous chemical reaction product present with a separate gas to form solid particles, and monitoring the amount of the solid particles as the target film is removed. Also, detection of a substance at very low concentrations in a liquid, by extracting the substance present as a gas from the liquid, mixing the gas with another substance to form solid particles, and monitoring the amount of the solid particles to detect the substance.

19 Claims, 4 Drawing Sheets

OTHER PUBLICATIONS

Biolsi, et al, "An Advanced Endpoint Detection Solution for <1% Open Areas", Solid State Technology, Dec. 1996, p. 59–67.

Economou, et al, "In Situ Monitoring of Etching Uniformity in Plasma Reactors", Solid State Technology, Apr. 1991, p. 107–111.

Roland, et al, "Endpoint Detecting in Plasma Etching", J. Vac. Sci. Technol. A3(3), May/Jun. 1985, p. 631–636.

Park, et al, "Real Time Monitoring of NH, Concentration Using Diffusion Scrubber Sampling Technique and Result of Application to the Processing of Chemiacally Amplified Resists", Jpn. J. Appl. Phys. vol. 34 (1995) pp. 6770–6773 Part 1 No. 12B, Dec., 1995.

Carr, et al, Technical Disclosure Bulletin, "End–Point Detection of Chemical/Mechanical Polishing of Circuitized Multilayer Substrates", YO887–0456, vol. 34 No. 4B, Sep. 1991 p. 406–407.

Carr, et al, Technical Disclosure Bulletin, "End–Point Detection of Chemical/Mechanical Polishing of Thin Film Structures", YO886–0830, vol. 34 No. 4A, Sep. 1991, p. 198–200.

Rutten, Research Diclosure Endpoint Detection Method for Ion Etching of Material Having a Titaniun Nitride Underlayer, BU890–0132, Feb. 1991, No. 322, Kenneth Mason Publications Ltd, England.

* cited by examiner

ENDPOINT DETECTION BY CHEMICAL REACTION AND LIGHT SCATTERING

RELATED APPLICATIONS

This invention is related to the following copending U.S. patent applications:

Ser. No. 09/073,605, entitled "Indirect Endpoint Detection by Chemical Reaction";

Ser. No. 09/073,602, entitled "Endpoint Detection by Chemical Reaction";

Ser. No. 09/073,607, entitled "Endpoint Detection by Chemical Reaction and Reagent";

Ser. No. 09/073,607, entitled "Indirect Endpoint Detection by Chemical Reaction and Chemiluminescence"; and Ser. No. 09/073,606, entitled "Endpoint Detection by Chemical Reaction and Photoionization";

all filed on the same day, all assigned to the present assignee, and all incorporated by reference in their entireties.

FIELD OF THE INVENTION

This invention is directed to semiconductor processing and more particularly to the detection of the endpoint for removal of one film overlying another film.

BACKGROUND OF THE INVENTION

In the semiconductor industry, critical steps in the production of integrated circuits are the selective formation and removal of films on an underlying substrate. The films are made from a variety of substances, and can be conductive (for example metal or a magnetic ferrous conductive material) or non-conductive (for example an insulator). Conductive films are typically used for wiring or wiring connections. Non-conductive or dielectric films are used in several areas, for example as interlevel dielectrics between layers of metallization, or as isolations between adjacent circuit elements.

Typical processing steps involve: (1) depositing a film, (2) patterning areas of the film using lithography and etching, (3) depositing a film which fills the etched areas, and (4) planarizing the structure by etching or chemical-mechanical polishing (CMP). Films are formed on a substrate by a variety of well-known methods, for example physical vapor deposition (PVD) by sputtering or evaporation, chemical vapor deposition (CVD), plasma enhanced chemical vapor deposition (PECVD). Films are removed by any of several well-known methods, for example chemical-mechanical polishing (also known as CMP), dry etching such as reactive ion etching (RIE), wet etching, electrochemical etching, vapor etching, and spray etching.

It is extremely important with removal of films to stop the process when the correct thickness has been removed (the endpoint has been reached). With CMP, a film is selectively removed from a semiconductor wafer by rotating the wafer against a polishing pad (or rotating the pad against the wafer, or both) with a controlled amount of pressure in the presence of a slurry. Overpolishing (removing too much) of a film results in yield loss, and underpolishing (removing too little) requires costly rework (redoing the CMP process). Various methods have been employed to detect when the desired endpoint for removal has been reached, and the polishing should be stopped.

The prior art methods for CMP endpoint detection suitable for all types of films involve the following types of measurement: (1) simple timing, (2) friction by motor current, (3) capacitive, (4) optical, (5) acoustical, and (6) conductive.

An exception to the above is U.S. Pat. No. 5,399,234 to Yu et al, in which a chemical reaction is described between potassium hydroxide in the polishing slurry and the layer being polished. The endpoint for polishing is monitored by sending acoustic waves through the slurry and detecting changes in the acoustic velocity as the concentration of reaction product (thought to be silanol in the case of polishing silicon dioxide) from the layer being polished decreases upon reaching an underlying polish stop layer.

These prior art methods each have inherent disadvantages such as inability for real-time monitoring, the need to remove the wafer from the process apparatus for examining the completion of polishing (not in-situ), or a lack of sensitivity.

These disadvantages have been overcome with an in-situ endpoint detection scheme for conductive films as described in U.S. Pat. No. 5,559,428 to Li et al titled "In-Situ Monitoring of the Change in Thickness of Films," however a suitable endpoint detection for non-conductive films has yet to be described.

Thus, there remains a need for an in-situ, real-time endpoint detection scheme suitable for use with all types of films. Such a scheme should have high detection sensitivity and extremely fast response time, preferably less than 1 or 2 seconds.

SUMMARY OF THE INVENTION

It is therefore an object of the present invention to provide a method and apparatus for detecting the endpoint for removal of any type of film overlying another film.

Another object of the present invention is to provide for in-situ endpoint detection as the film is being removed.

Yet another object is to provide endpoint detection with high detection sensitivity and extremely fast response time.

In accordance with the above listed and other objects, a method for detecting the endpoint for removal of a target film overlying a stopping film, by (a) removing the target film with a process that selectively produces a gaseous chemical reaction product with one of the stopping film and the target film, (b) mixing the gaseous chemical reaction product present with a separate gas to form solid particles, and (c) monitoring the amount of the solid particles as the target film is removed is described. A method for detecting a substance at very low concentrations in a liquid, by extracting the substance present as a gas from the liquid, mixing the gas with another substance to form solid particles, and monitoring the amount of the solid particles to detect the substance is also described.

DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of chemical-mechanical polishing merely as a specific example, and is not meant to limit applicability of the invention to semiconductor technology. Those skilled in the art will understand that the invention is broadly applicable to any process in which it is desirable to detect the endpoint for removal of a target film overlying a stopping film, by (a) removing the target film with a process that selectively produces a gaseous chemical reaction product with one of the stopping film and the target film, (b) mixing the gaseous chemical reaction product present with a separate gas to form solid particles, and (c) monitoring the amount of the solid particles as the target film is removed. The invention is also broadly applicable to any process in which it is desirable to detect a substance at very low concentrations in a liquid, by extracting the substance present as a gas from the liquid, mixing the gas with another substance to form solid particles, and monitoring the amount of the solid particles to detect the substance.

Figure 1:
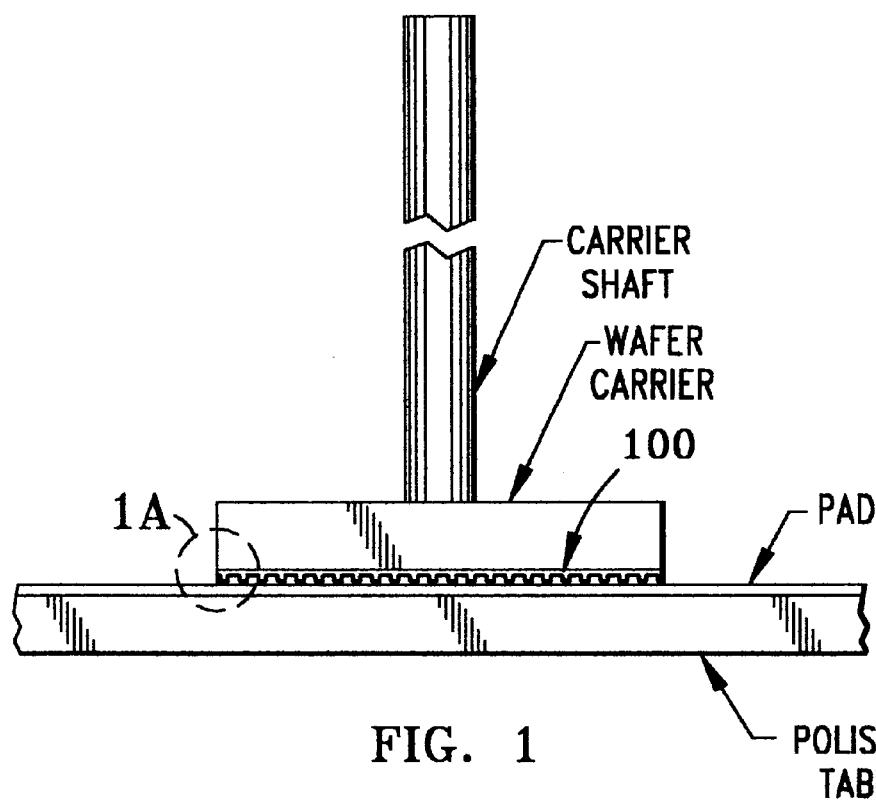
FIG. 1 shows a cross-section of a target film to be chemically-mechanically polished.
Figure 1A:
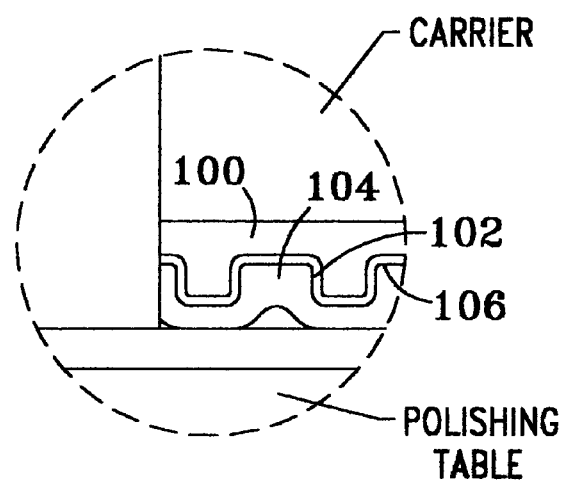

As shown in FIG. 1, we have discovered that when chemically-mechanically polishing a substrate 100 with a target film of oxide ($SiO_2$) 104 over a stopping film of nitride ($Si_3N_4$) 102 with a slurry containing potassium hydroxide (KOH), a chemical reaction occurs when the interface 106 is reached, resulting in the production of ammonia ($NH_3$). More specifically, the slurry used is a mixture of fumed silica, water, and KOH, with a pH of about 10.5. When polishing oxide, the following reaction occurs:

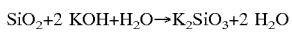

When polishing nitride, the following reaction occurs:

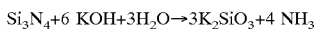

The ammonia produced is dissolved in the slurry, and because of the relatively high pH it exists primarily in the form of $NH_3$ rather than $NH_4^+$. Thus the change of ammonia level in the slurry indicates that the underlying nitride film has been reached, and the endpoint for removal of the oxide film can be determined by monitoring the level of ammonia in the slurry. Once the endpoint is reached, the polishing can be stopped.

More generally, the endpoint for removal of any non-nitride-containing film overlying a nitride-containing film can be detected by monitoring the level of ammonia in the slurry. Conversely, the endpoint for removal of a nitride-containing film overlying a non-nitride-containing film can also be detected in a similar manner, with a marked decrease in the presence of ammonia indicating the endpoint.

Even more generally, the endpoint for removal of any film overlying another film can be detected by monitoring the level of a chemical reaction product in the slurry as a component of the slurry reacts selectively with one of the films (either the overlying or underlying film). The reaction described above producing ammonia will be discussed as follows but is not intended to limit the scope of the invention to that particular embodiment. In order to implement the above discovery concerning the production of ammonia in an environment suitable for manufacturing, in-situ (i.e. while the wafer is being polished) slurry collection and sampling is required. Preferably, the collection and sampling provide a rapid response with high sensitivity (to ammonia) and minimizes the effect of interference from other substances in the slurry and in the surrounding air.

Unfortunately, the slurry described above already contains ammonia prior to being used for polishing. The ammonia concentration varies from as low as $5.0 \times 10^{-6}$ M to as high as $5.0 \times 10^{-5}$ M. The ammonia produced in the slurry when polishing a blanket (i.e. uniform) layer of nitride is approximately $1.0 \times 10^{-4}$ M at room temperature; for a typical low pattern factor production wafer having a nitride layer which covers 15% of the wafer area (the rest being oxide), polishing at the interface of the oxide/(oxide+nitride) produces $1.5 \times 10^{-5}$ M. The desired concentration change will not be able to be distinguished from the fluctuation of the pre-polish ammonia concentration. Therefore the ammonia concentration prior to polishing must be reduced in order to achieve the desired sensitivity.

Figure 2:
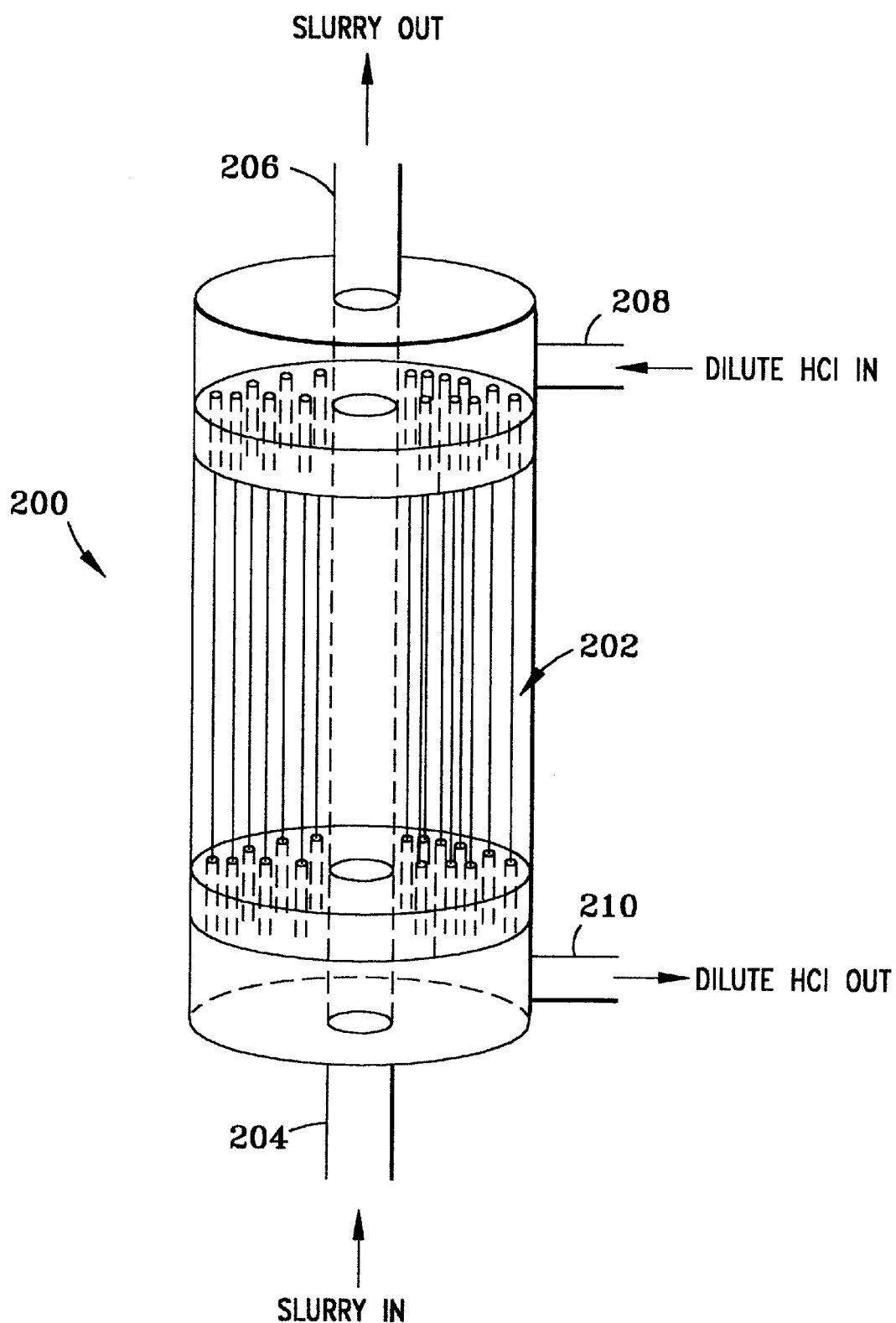
FIG. 2 shows a cross-section of an ammonia scrubber for reducing pre-polish ammonia concentration in the slurry.

The reduction in pre-polish ammonia concentration is achieved by using an ammonia scrubber, resulting in a concentration of approximately $2.5 \times 10^{-6}$ M. The main component of the scrubber is a Liqui-Cel Membrane Contactor 200 (model Extra-Flow 4×28 made by Hoechst Celanese) shown in FIG. 2. The Contactor contains Celgard (TM) microporous polypropylene fibers 202 which are hydrophobic and do not allow water-based solutions to penetrate through the fiber membranes, but do allow gas exchange. Slurry from a reservoir enters contactor 200 at 204 and flows through contactor 200 on the outside of the fibers (also called shellside) allowing ammonia to permeate to the inside of the fibers (also called lumenside) before exiting at 206 and recirculating back to 204. To facilitate removal of the ammonia in the slurry, an aqueous HCl solution from another reservoir with a pH of approximately 3 is circulated in the lumenside, entering at 208 and exiting at 210 before recirculating back to 208. Ammonia gas from the slurry crossing into this HCl stream is immediately converted to $NH_4^+$ by a moderately high concentration of protons, therefore effectively preventing a possible buildup of any appreciable amount of $NH_3$ in the lumenside of the scrubber. The recirculating aqueous HCl stream and reservoir can then be the sink for a large amount of ammonia from the slurry.

With an aqueous HCl reservoir of approximately 10 liters of water adjusted to a pH of 3.5 using 0.1 M HCl solution, and 10 liters of $1.0 \times 10^{-4}$ M ammonia solution at a pH of 10.7 passing through the above-described contactor, the ammonia level was reduced to the desired $2.5 \times 10^{-6}$ M in 30 minutes. The time can be reduced by increasing the size of the contactor, using several contactors in series, or gently heating the slurry to increase the volatility of the ammonia, or any combination of the three. The desired target ammonia level in the slurry can be measured by a commercially available detector such as an ammonia specific ion selective electrode (ISE).

Once the slurry has reached the desired target ammonia level, it is used to polish a wafer. The slurry is then collected from the polishing pad for sampling during the polishing process.

EXTRACTION OF AMMONIA GAS FROM THE SLURRY

Figure 3:
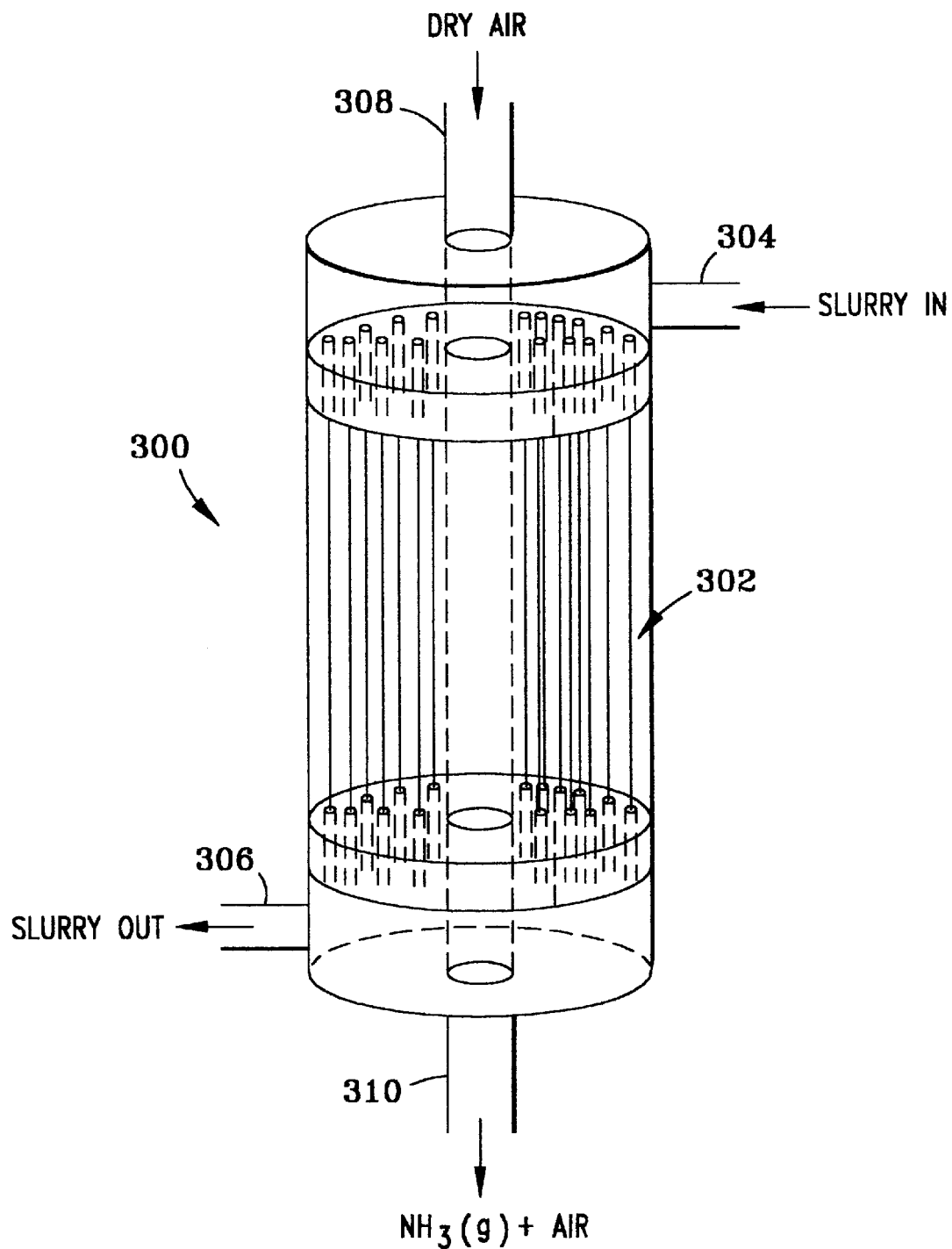
FIG. 3 shows a cross-section of an extraction unit for extracting ammonia gas from the slurry.

In order to detect and monitor ammonia in a gaseous form, thus enabling methods such as mass spectroscopy, slurry from the polishing apparatus (not shown) is pumped through an ammonia extraction unit 300 shown in FIG. 3. Extraction unit 300 is constructed from polypropylene microporous hollow fibers 302 obtained from a dismantled Liqui-Cel Contactor (model 2.5×8 made by Hoechst Celanese). Fibers 302 allow gas but not liquid to pass from the outside to the inside of the fibers.

Slurry is pumped in at 304 through extraction unit 300 on the outside of fibers 302 and exits at 306. Dry air (from a drier containing an ammonia filter) is pumped in at 308 through the inside of the fibers and exits containing ammonia gas at 310. The carrier gas is pumped at a reduced pressure of approximately 30 Torr to facilitate ammonia transport from the slurry through the fibers and into the gas stream. The reduced pressure also increases the overall flow velocity, which helps to reduce the response time for measuring the level of ammonia.

The ammonia-containing gas stream from extractor 300 can then be analyzed and monitored for endpoint detection for removal of the target film.

LIGHT SCATTERING

After the ammonia gas has been extracted from the slurry, it can be detected by mixing it with hydrochloric acid vapor and monitoring the formation of solid particles of ammonium chloride according to the equation:

$$NH_3\ (g) + HCl\ (g) + nH_2O \rightarrow NH_4Cl(H_2O)n\ (s)$$

Figure 4:
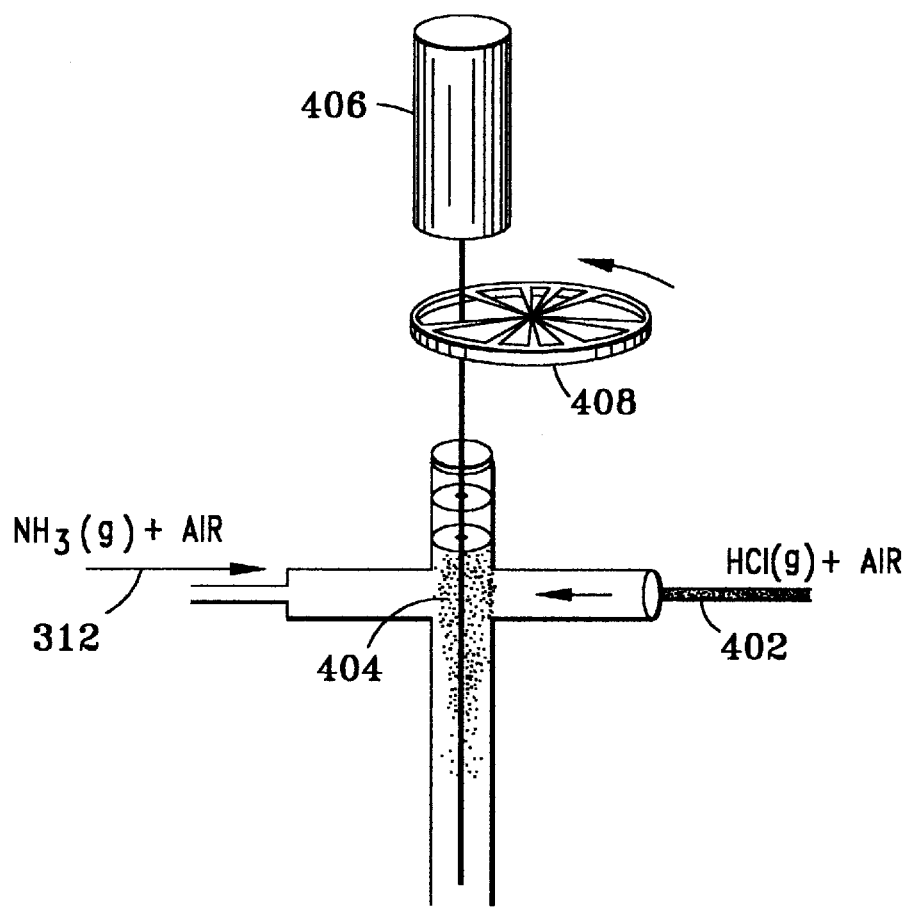
FIG. 4 shows the setup for detecting the ammonia gas using light scattering.

The setup for this monitoring scheme is shown in FIG. 4. Ammonia-containing gas stream 312 from FIG. 3 is mixed with an air stream 402 containing a known concentration of gaseous HCl with well-controlled humidity. Upon mixing, the ammonia and hydrochloric acid vapors react immediately to form solid ammonium chloride particles 404. The amount of ammonium chloride 404 produced is measured by monitoring macroscopic scattering from particles 404 using a laser beam 406, for example from a Helium Neon laser.

Figure 5:
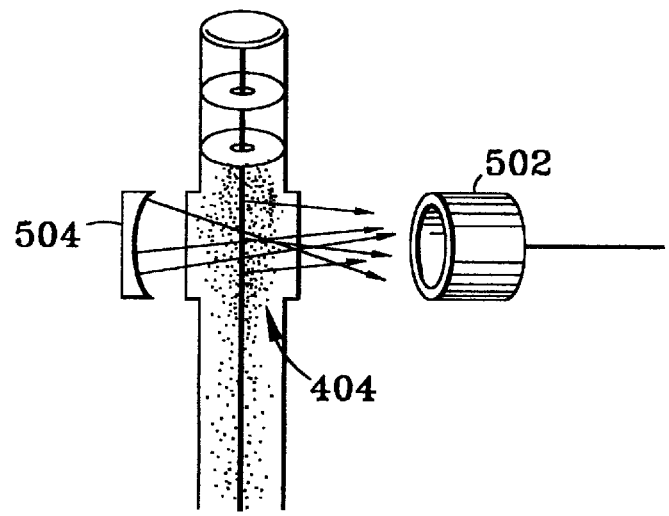
FIG. 5 shows an expanded view of the monitoring from FIG. 4; all in accordance with the present invention.

FIG. 5 shows how the scattering is monitored. The scattered photons produced by laser beam 406 hitting particles 404 are detected by a photomultiplier 502. A mirror collection system 504 is preferably used to enhance light collection efficiency. The sensitivity of the technique can be increased by using a mechanical chopper 408 in FIG. 4 (for example Stanford Research Systems Model SR450) and a lock-in amplifier (not shown; for example Stanford Research Systems Model SR810) synchronized with the chopper for phase sensitive detection. The amount of scattered light is proportional to the ammonia concentration in the slurry as the wafer is being polished.

The reaction to form the solid particles is rapid, since it is a simple acid-base reaction, and selective to ammonia since very few gas molecules behave like a base. The reaction takes place in less than 1 second, which is very suitable for an endpoint detection scheme as described.

Note that the light scattering method and apparatus described are not restricted to use with monitoring the endpoint for CMP. If an overlying film is being removed from an underlying film by etching, for example dry etching (e.g. reactive ion etching), an underlying film (i.e. etch stop) may be selected which generates a marker chemical reaction product upon contact with the etchants. The reaction products of the etching process can be sampled by the method described in order to monitor the level of the marker chemical reaction product.

The light scattering method may also be used to detect a substance such as ammonia at very low (e.g. $1.0 \times 10^{-5}$ M or lower) concentrations in a liquid, by extracting the chemical present in a gaseous form from the liquid, mixing the gas with another substance to form solid particles, and monitoring the amount of solid particles, for example by scattered light.

In summary, a method and associated apparatus have been described which are capable of detecting the endpoint for removal of any type of film overlying another film. The present invention provides for in-situ endpoint detection as the film is being removed, and with high detection sensitivity and extremely fast response time.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for detecting the endpoint for removal of a target film overlying a stopping film in a chemical-mechanical polishing process using a slurry, the method comprising the steps of:

(a) extracting a gaseous species from the slurry;

(b) after step (a), removing the target film to selectively produce in the slurry said gaseous species as a gaseous chemical reaction product with one of the stopping film and the target film;

(c) after step (b), extracting the chemical reaction product as a gas from the slurry;

(d) mixing the gaseous chemical reaction product extracted in step (c) with a separate gas to form solid particles; and (e) monitoring the amount of the solid particles as the target film is removed by contacting the particles with a laser beam to produce light scattering and measuring the light scattering.

2. The method of claim 1 wherein the level of chemical reaction product is monitored by light scattering.

3. The method of claim 1 wherein the extraction step comprises:

contacting a first side of a hydrophobic permeable membrane with the slurry;

contacting a second side of the membrane with a gas stream; and allowing the chemical reaction product to pass through the membrane as a gas and become entrained in the gas stream.

4. The method of claim 1 wherein the laser beam is produced with a helium-neon laser.

5. The method of claim 7 further comprising mechanically chopping the scattered light.

6. The method of claim 5 further comprising lock-in amplifying the scattered light.

7. The method of claim 1 wherein the gaseous chemical reaction product is ammonia.

8. The method of claim 1 wherein the separate gas is hydrochloric acid gas.

9. The method of claim 1 further comprising the step of stopping the removal process when the endpoint has been reached.

10. The method of claim 1 wherein the process selectively produces a gaseous chemical reaction product with the stopping film.

11. The method of claim 10 wherein the amount of solid particles increases as the target film is removed.

12. The method of claim 1 wherein process selectively produces a gaseous chemical reaction product with the target film.

13. The method of claim 12 wherein the amount of solid particles decreases as the target film is removed.

14. A method for detecting a substance at very low concentrations in a liquid, comprising the steps of:

extracting the substance present as a gas from the liquid;

mixing the gas with another substance to form solid particles; and monitoring the amount of the solid particles to detect the substances, wherein said monitoring includes contacting the particles with a laser beam to produce light scattering and measuring the light scattering.

15. The method of claim 14 wherein the concentration is less than or equal to $1.0 \times 10^{-5}$ Molar.

16. The method of claim 14 wherein the extracting step comprises:

contacting a first side of a hydrophobic permeable membrane with the substance-containing liquid;

contacting a second side of the membrane with a gas stream; and allowing the substance to pass through the membrane as a gas and become entrained in the gas stream.

17. The method of claim 14 wherein the laser beam is produced with a helium-neon laser.

18. The method of claim 14 further comprising mechanically chopping the scattered light.

19. The method of claim 18 further comprising lock-in amplifying the scattered light.

* * * * *